(12) United States Patent
Yoshida et al.

(10) Patent No.: US 10,379,229 B2
(45) Date of Patent: Aug. 13, 2019

(54) RADIATION DETECTOR AND METHOD FOR PRODUCING SAME

(71) Applicant: HAMAMATSU PHOTONICS K.K., Hamamatsu-shi, Shizuoka (JP)

(72) Inventors: Narihiro Yoshida, Hamamatsu (JP); Syouji Kurebayashi, Hamamatsu (JP); Kiyotaka Yoshida, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/563,641

(22) PCT Filed: Feb. 1, 2016

(86) PCT No.: PCT/JP2016/052919
§ 371 (c)(1),
(2) Date: Oct. 2, 2017

(87) PCT Pub. No.: WO2016/170812
PCT Pub. Date: Oct. 27, 2016

(65) Prior Publication Data
US 2018/0074216 A1 Mar. 15, 2018

(30) Foreign Application Priority Data
Apr. 20, 2015 (JP) ................................. 2015-085687

(51) Int. Cl.
*G01T 1/20* (2006.01)
*B32B 7/12* (2006.01)
(Continued)

(52) U.S. Cl.
CPC .............. *G01T 1/2018* (2013.01); *B32B 7/12* (2013.01); *G01T 1/20* (2013.01); *G01T 1/202* (2013.01);
(Continued)

(58) Field of Classification Search
CPC .......... G01T 1/2018; G01T 1/202; G01T 3/06
See application file for complete search history.

(56) References Cited

U.S. PATENT DOCUMENTS 3,855,035 A * 12/1974 Bates, Jr. ................ B32B 27/08
156/276
3,917,950 A * 11/1975 Carlson ................ G01N 23/043
250/214 VT
(Continued)

FOREIGN PATENT DOCUMENTS

CN     1220732 A    6/1999
CN   102655160 A    9/2012
(Continued)

OTHER PUBLICATIONS

International Preliminary Report on Patentability dated Nov. 2, 2017 for PCT/JP2016/052919.

*Primary Examiner* — David P Porta
*Assistant Examiner* — Djura Malevic
(74) *Attorney, Agent, or Firm* — Drinker Biddle & Reath LLP

(57) ABSTRACT

A radiation detector includes: a light detection panel that has a light-receiving unit, and a bonding pad that is electrically connected to the light-receiving unit; a scintillator layer that is provided on the light detection panel to cover the light-receiving unit; and a protective layer that is provided on the light detection panel to cover the scintillator layer. An outer edge portion of the protective layer has an adhesive portion that is in close contact with the light detection panel in a region between the scintillator layer and the bonding pad, and an extension that extends from the adhesive portion to an opposite side of the light detection panel in a self-supporting state.

7 Claims, 9 Drawing Sheets

(51) Int. Cl.
*G01T 1/202* (2006.01)
*G01T 3/06* (2006.01)
*H01L 27/146* (2006.01)
*H01L 31/032* (2006.01)

(52) U.S. Cl.
CPC .............. *G01T 1/2008* (2013.01); *G01T 3/06* (2013.01); *H01L 27/14663* (2013.01); *H01L 31/032* (2013.01); H01L 27/1462 (2013.01); H01L 27/14618 (2013.01); H01L 27/14636 (2013.01)

(56) References Cited

U.S. PATENT DOCUMENTS

| | | | | |
|---|---|---|---|---|
| 4,145,609 A * | 3/1979 | Takami | ................ | G01T 1/1642 250/361 R |
| 5,148,029 A * | 9/1992 | Persyk | ................ | G01T 1/1644 250/361 R |
| 6,172,371 B1 * | 1/2001 | DeJule | ................ | G01T 1/2002 250/361 R |
| 6,262,422 B1 * | 7/2001 | Homme | ................ | G01T 1/2018 250/367 |
| 6,573,506 B2 * | 6/2003 | Sato | ................ | G01T 1/2002 250/361 R |
| 6,692,836 B2 * | 2/2004 | Reichert | ................ | G02B 5/0858 428/469 |
| 6,720,561 B2 * | 4/2004 | Baumgartner | ................ | G01T 1/2002 250/370.09 |
| 6,803,583 B2 * | 10/2004 | Taylor | ................ | H01J 37/244 250/397 |
| 6,835,936 B2 * | 12/2004 | Okada | ................ | G01T 1/2002 250/336.1 |
| 6,847,041 B2 * | 1/2005 | Okada | ................ | G01T 1/2018 250/370.01 |
| 7,034,306 B2 * | 4/2006 | Homme | ................ | G01T 1/202 250/368 |
| 7,064,335 B2 * | 6/2006 | Suzuki | ................ | G01T 1/20 250/368 |
| 7,087,908 B2 * | 8/2006 | Homme | ................ | G01T 1/2018 250/483.1 |
| 7,112,802 B2 * | 9/2006 | Ogawa | ................ | G01T 1/026 250/370.11 |
| 7,126,130 B2 * | 10/2006 | Hennessy | ................ | G01T 1/2002 250/370.11 |
| 7,132,665 B2 * | 11/2006 | Sato | ................ | G01T 1/2002 250/368 |
| 7,141,803 B2 * | 11/2006 | Homme | ................ | G01T 1/2018 250/483.1 |
| 7,151,263 B2 * | 12/2006 | Homme | ................ | G01T 1/20 250/370.11 |
| 7,244,945 B2 * | 7/2007 | Okada | ................ | G01T 1/2018 250/336.1 |
| 7,315,027 B2 * | 1/2008 | Okada | ................ | G01T 1/2018 250/370.11 |
| RE40,291 E * | 5/2008 | Homme | ................ | 250/367 |
| 7,391,029 B2 * | 6/2008 | Takeda | ................ | G01T 1/2018 216/25 |
| 7,405,406 B1 * | 7/2008 | Nagarkar | ................ | G01T 1/2018 250/366 |
| 7,408,177 B2 * | 8/2008 | Homme | ................ | G01T 1/202 250/483.1 |
| 7,514,686 B2 * | 4/2009 | Ogawa | ................ | G01T 1/2002 250/361 R |
| 7,538,330 B2 * | 5/2009 | Nomura | ................ | G01T 1/2018 250/367 |
| 7,595,493 B2 * | 9/2009 | Okada | ................ | G21K 4/00 250/367 |
| 7,718,974 B2 * | 5/2010 | Schulz | ................ | G01T 1/20 250/370.11 |
| 7,910,892 B2 * | 3/2011 | Horiuchi | ................ | G01T 1/2018 250/361 R |
| 7,982,190 B2 * | 7/2011 | Homma | ................ | G01T 1/20 250/361 R |
| 8,779,369 B2 * | 7/2014 | Ichimura | ................ | G21K 4/00 250/369 |
| 8,822,940 B2 * | 9/2014 | Moon | ................ | H01L 27/14676 250/370.11 |
| 8,829,454 B2 * | 9/2014 | Bolognia | ................ | H01L 31/024 250/370.09 |
| 8,841,621 B2 * | 9/2014 | Nariyuki | ................ | G01T 1/2002 250/366 |
| 8,853,808 B2 * | 10/2014 | Homma | ................ | G01T 1/244 257/428 |
| 8,957,383 B2 * | 2/2015 | Sasaki | ................ | G01T 1/20 250/361 R |
| 8,975,589 B2 * | 3/2015 | Ichimura | ................ | G01T 1/202 250/366 |
| 9,006,665 B2 * | 4/2015 | Nagano | ................ | G01T 1/2002 250/363.01 |
| 9,052,400 B2 * | 6/2015 | Saruta | ................ | G01T 1/2018 |
| 9,054,012 B2 * | 6/2015 | Nomura | ................ | H01L 27/14685 |
| 9,116,022 B2 * | 8/2015 | Bolognia | ................ | H01L 31/0203 |
| 9,366,767 B2 * | 6/2016 | Inoue | ................ | G01T 1/202 |
| 9,535,170 B2 * | 1/2017 | Jonishi | ................ | G21K 4/00 |
| 9,568,617 B2 * | 2/2017 | Ichimura | ................ | G01T 1/2018 |
| 9,702,986 B2 * | 7/2017 | Peters | ................ | G01T 1/2018 |
| 10,061,035 B2 * | 8/2018 | Kurebayashi | ................ | G01T 1/2018 |
| 2001/0045522 A1 * | 11/2001 | Homme | ................ | G01T 1/2018 250/361 R |
| 2002/0017613 A1 * | 2/2002 | Homme | ................ | G01T 1/2002 250/370.11 |
| 2002/0074502 A1 * | 6/2002 | Takabayashi | ................ | G01T 1/202 250/368 |
| 2002/0158205 A1 * | 10/2002 | Sato | ................ | G01T 1/2002 250/361 R |
| 2002/0192471 A1 * | 12/2002 | Homme | ................ | B32B 9/00 428/408 |
| 2003/0160185 A1 * | 8/2003 | Homme | ................ | G01T 1/2018 250/483.1 |
| 2003/0173493 A1 * | 9/2003 | Homme | ................ | G01T 1/2018 250/200 |
| 2003/0205674 A1 * | 11/2003 | Sato | ................ | G01T 1/2002 250/368 |
| 2004/0000644 A1 * | 1/2004 | Homme | ................ | G01T 1/2018 250/361 R |
| 2004/0089813 A1 * | 5/2004 | Takabayashi | ................ | G01T 1/2018 250/370.11 |
| 2004/0155320 A1 * | 8/2004 | DeJule | ................ | G01T 1/2018 257/659 |
| 2004/0178350 A1 * | 9/2004 | Nagano | ................ | G01T 1/2018 250/370.11 |
| 2004/0195514 A1 * | 10/2004 | Nagano | ................ | G01T 1/2018 250/370.11 |
| 2005/0035298 A1 * | 2/2005 | Okada | ................ | G01T 1/2018 250/370.11 |
| 2005/0092927 A1 * | 5/2005 | Nagano | ................ | G01T 1/2928 250/370.11 |
| 2005/0167604 A1 * | 8/2005 | Suganuma | ................ | G01T 1/2928 250/370.11 |
| 2007/0045554 A1 * | 3/2007 | Wakamatsu | ................ | G01T 1/2018 250/370.11 |
| 2007/0205371 A1 * | 9/2007 | Inoue | ................ | G01T 1/2018 250/370.11 |
| 2007/0272867 A1 * | 11/2007 | Tahon | ................ | G01T 1/2023 250/361 R |
| 2009/0283685 A1 * | 11/2009 | Takeda | ................ | A61B 6/4233 250/370.11 |
| 2010/0028557 A1 * | 2/2010 | Nagano | ................ | G01T 1/2018 427/535 |
| 2011/0017911 A1 * | 1/2011 | Flamanc | ................ | C09K 11/02 250/361 R |
| 2011/0309258 A1 * | 12/2011 | Ishida | ................ | G01T 1/20 250/369 |
| 2012/0223240 A1 * | 9/2012 | Ichimura | ................ | G21K 4/00 250/369 |
| 2012/0288688 A1 * | 11/2012 | Kug | ................ | G21K 4/00 428/177 |

(56) References Cited

U.S. PATENT DOCUMENTS

| | | | | |
|---|---|---|---|---|
| 2013/0112882 A1* | 5/2013 | Osawa | ............... | G01T 1/202 |
| | | | | 250/361 R |
| 2014/0284487 A1* | 9/2014 | Sawada | ............... | G01T 1/202 |
| | | | | 250/368 |
| 2014/0374608 A1* | 12/2014 | Sasaki | ............... | H01L 31/02322 |
| | | | | 250/366 |
| 2016/0041278 A1* | 2/2016 | Gorouya | ............... | G01T 7/00 |
| | | | | 250/366 |
| 2016/0116606 A1* | 4/2016 | Itaya | ............... | G01T 1/2023 |
| | | | | 250/366 |
| 2018/0074216 A1* | 3/2018 | Yoshida | ............... | G01T 1/2018 |

FOREIGN PATENT DOCUMENTS

| | | |
|---|---|---|
| JP | 2004-226313 A | 8/2004 |
| JP | 2005-338067 A | 12/2005 |
| JP | 4445281 B2 | 4/2010 |
| JP | 2012-181108 A | 9/2012 |
| JP | 2014-81364 A | 5/2014 |
| WO | WO 98/036291 A1 | 8/1998 |

* cited by examiner

RADIATION DETECTOR AND METHOD FOR PRODUCING SAME

TECHNICAL FIELD

The present invention relates to a radiation detector, and a method for producing same.

BACKGROUND ART

There is a conventionally known radiation detector which includes a light detection panel having a light-receiving unit and a bonding pad, a scintillator layer provided on light detection panel to cover the light-receiving unit, a protective layer provided on the light detection panel to cover the scintillator layer, and a resin member which holds an outer edge portion of the protective layer in a region between the scintillator layer and the bonding pad (see, for example, Patent Literature 1).

CITATION LIST

Patent Literature

Patent Literature 1: Japanese Patent No. 4445281

SUMMARY OF INVENTION

Technical Problem

In the aforementioned radiation detector, since the outer edge portion of the protective layer is held by a resin member, the moisture resistance of the scintillator layer is secured. However, since the resin member is disposed in the region between the scintillator layer and the bonding pad, the region is widened. When the region becomes wider, there is a possibility that it is difficult to reduce the size of the radiation detector while maintaining the size of the light-receiving unit, or to increase the size of the light-receiving unit while maintaining the size of the radiation detector. In addition, since the wiring for electrically connecting the light-receiving unit and the bonding pad is elongated, there is a possibility that it becomes difficult to improve the transmission speed of the electric signal and there is a possibility that the noise increases.

Thus, an object of the present invention is to provide a radiation detector capable of suppressing a region between a scintillator layer and a bonding pad from being widened, while securing moisture resistance of the scintillator layer and a method for producing the radiation detector.

Solution to Problem

According to an aspect of the present invention, there is provided a radiation detector including: a light detection panel that has a light-receiving unit, and a bonding pad that is electrically connected to the light-receiving unit; a scintillator layer that is provided on the light detection panel to cover the light-receiving unit; and a protective layer that is provided on the light detection panel to cover the scintillator layer. An outer edge portion of the protective layer has an adhesive portion that is in close contact with the light detection panel in a region between the scintillator layer and the bonding pad, and an extension that extends from the adhesive portion to an opposite side of the light detection panel in a self-supporting state.

In the radiation detector according to an aspect of the present invention, the outer edge portion of the protective layer covering the scintillator layer has a adhesive portion coming into close contact with the light detection panel. This makes it possible to prevent moisture from entering the scintillator layer through a gap between the protective layer and the light detection panel. Further, the outer edge portion of the protective layer has the extension that extends from the adhesive portion to the opposite side of the light detection panel in a self-supporting state. If the outer edge portion of the protective layer does not have the extension, the outer edge of the protective layer is included in the adhesive portion. In this case, it is difficult to secure adhesion between a portion, particularly, in the adhesive portion in which the outer edge of the protective layer is located, and the light detection panel. As a result, moisture easily enters the scintillator layer from the interface between the adhesive portion and the light detection panel. In contrast, in the aforementioned radiation detector, since the outer edge portion of the protective layer has the extension and the outer edge of the protective layer is not included in the adhesive portion, it is possible to sufficiently secure the adhesion between the adhesive portion and the light detection panel, and to improve the moisture resistance of the scintillator layer. Therefore, it is possible to maintain the moisture resistance of the scintillator layer without holding the outer edge portion of the protective layer with the resin member unlike the conventional case. Furthermore, since it is not necessary to provide such a resin member, the region between the scintillator layer and the bonding pad can be narrowed. Therefore, according to the radiation detector of an aspect of the present invention, it is possible to suppress the region between the scintillator layer and the bonding pad from being widened, while securing the moisture resistance of the scintillator layer.

In the radiation detector, the protective layer may have a light reflection film, a first protective film that is disposed on the scintillator layer side with respect to the light reflection film, and a second protective film that is disposed on the opposite side of the scintillator layer with respect to the light reflection film since the protective layer includes the light reflection film as described above, it is possible to prevent light generated in the scintillator layer from leaking to the outside (a portion other than the light-receiving unit), and to improve the sensitivity of the radiation detector.

In the radiation detector, an outer edge of the light reflection film may be located inside an outer edge of the protective layer, the outer edge of the first protective film and the outer edge of the second protective film may be located at the outer edge of the protective layer, and the outer edge portion of the first protective film and the outer edge portion of the second protective film may be joined to each other outside the outer edge of the light reflection film to cover the outer edge portion of the light reflection film. For example, even when the adhesion between the light reflection film and the first protective film or the adhesion between the light reflection film and the second protective film is not good, since the outer edge portion of the light reflection film is sealed with the outer edge portion of the first protective film and the outer edge portion of the second protective film, the adhesion between the films can be secured.

In the radiation detector, the light reflection film may be a metal film made of aluminum or silver. Alternatively, the light reflection film may be a resin film containing a white pigment. Thus, the light reflection film can have good light reflectivity.

In the radiation detector, the height of the extension may be 80 μm to 250 μm. This makes it possible to more reliably ensure the moisture resistance of the scintillator layer.

A method for producing a radiation detector according to an aspect of the present invention includes: preparing a light detection panel having a light-receiving unit and a bonding pad electrically connected to the light-receiving unit, and providing a scintillator layer on the light detection panel to cover the light-receiving unit; providing a masking member on the light detection panel to cover the bonding pad; providing a protective layer on the light detection panel to cover the scintillator layer, a region between the scintillator layer and the bonding pad, and the masking member; cutting the protective layer on the masking member by irradiating a laser beam along an edge portion of the scintillator layer side of the masking member; and removing the masking member.

In the method for producing a radiation detector according to an aspect of the present invention, the bonding pad is covered with the masking member, and the protective layer is provided to cover the scintillator layer, the region between the scintillator layer and the bonding pad, and the masking member. As a result, the protective layer has the adhesive portion that comes into close contact with the light detection panel in the region between the scintillator layer and the bonding pad. Further, a step due to the thickness of the masking member is generated between the edge of the masking member and the light detection panel, but the protective layer is also formed along the step. As a result, the protective layer has the extension extending from the adhesive portion to the side opposite to the light detection panel. Further, by irradiating the laser beam along the edge portion of the scintillator layer side of the masking member, the protective layer is cut on the masking member, and the masking member is removed. As a result, the bonding pad is exposed, and the extension is in a self-supporting state. Thus, the produced radiation detector has the adhesive portion that comes into close contact with the light detection panel in the region between the scintillator layer and the bonding pad, and the extension extending from the adhesive portion to the opposite side of the light detection panel in a self-supporting state. Therefore, according to the method for producing a radiation detector of an aspect of the present invention, it is possible to obtain a radiation detector capable of suppressing the region between the scintillator layer and the bonding pad from being widened, while securing the moisture resistance of the scintillator layer.

Advantageous Effects of Invention

According to the present invention, it is possible to suppress the region between the scintillator layer and the bonding pad from being widened, while maintaining the moisture resistance of the scintillator layer.

DESCRIPTION OF EMBODIMENTS

Figure 1:
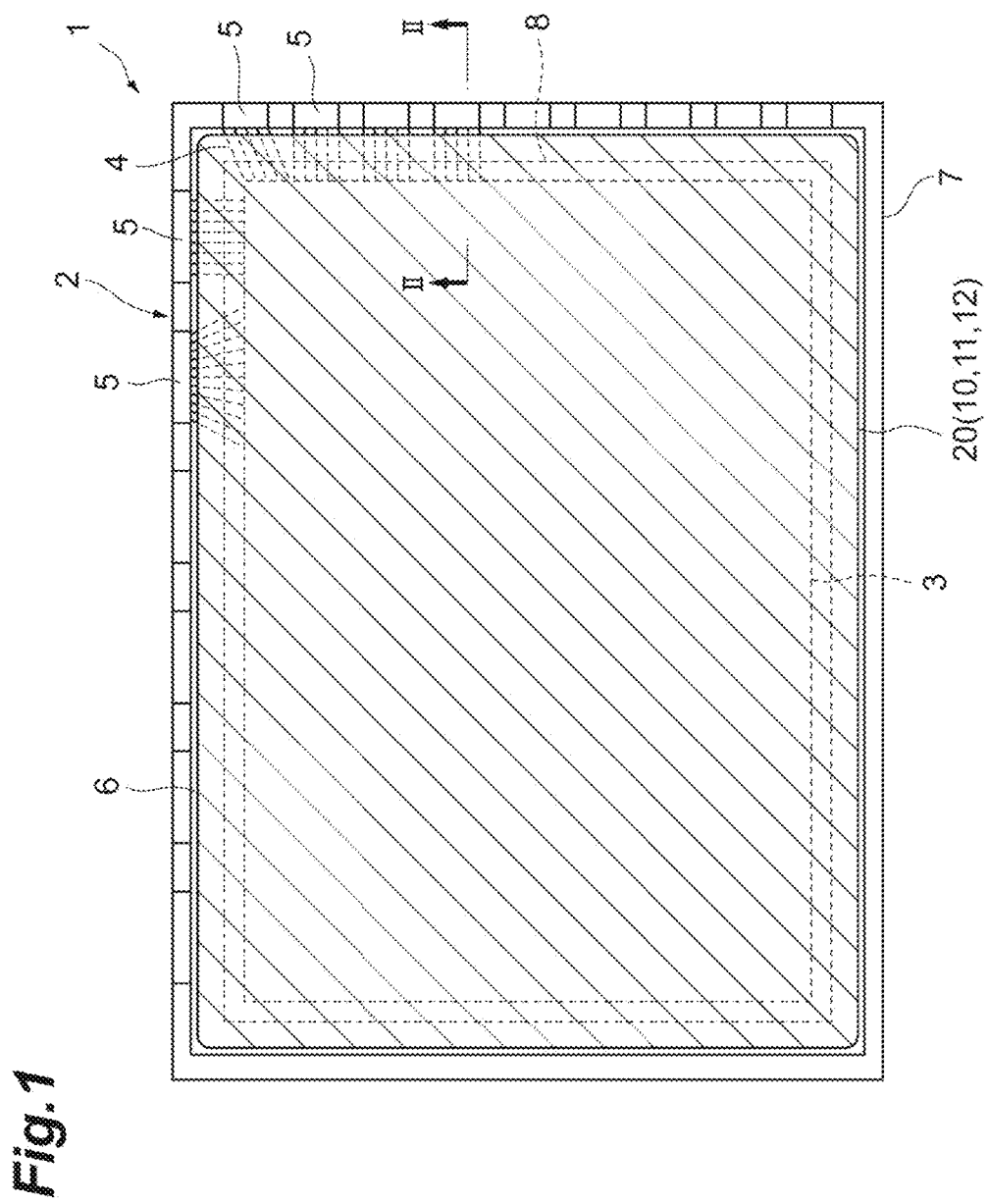
FIG. 1 is a plan view of a radiation detector according to an embodiment of the present invention.

Hereinafter, embodiments of the present invention will be described with reference to the drawings. If possible, the same parts are denoted by the same reference numerals, and repeated description will not be provided. In addition, the dimensions and shapes in each drawing are not necessarily the same as the actual ones.

First, with reference to FIG. 1 and FIG. 2, a configuration of a radiation detector 1 according to the present embodiment will be described. The radiation detector 1 includes a light detection panel 7. The light detection panel 7 includes a substrate 2, a light-receiving unit 3, a signal line 4, a bonding pad 5, and a passivation film 6. The substrate 2 is, for example, a silicon substrate on which a metal oxide semiconductor field effect transistor (MOSFET) is fainted. The light-receiving unit 3 includes a plurality of photoelectric conversion elements 3a two-dimensionally arranged in a rectangular region at the center of the substrate 2. The photoelectric conversion elements 3a are configured using, for example, a photodiode (PD), a thin film transistor (TFT), or the like. The signal line 4 is provided on the substrate 2 and electrically connects the bonding pad 5 and the light-receiving unit 3. The bonding pad 5 is used to extract the electric signal generated in the light-receiving unit 3 to an external circuit.

A plurality of bonding pads 5 is disposed at predetermined intervals along two adjacent sides (an upper side and a right side in FIG. 1) of the outer edge of the substrate 2. However, the arrangement of the bonding pads 5 is not limited thereto. For example, a plurality of bonding pads 5 may be disposed at predetermined intervals only along one side of the outer edge of the substrate 2, or may be disposed at predetermined intervals along all sides (four sides) of the outer edge of the substrate 2. Each bonding pad 5 is electrically connected to a corresponding plurality of photoelectric conversion elements 3a via the signal lines 4.

The passivation film 6 is formed on the photoelectric conversion element 3a and the signal line 4. As the passivation film 6, for example, silicon nitride, silicon oxide, or the like is used. The passivation film 6 is formed so that the bonding pad 5 is exposed.

A scintillator layer 8 is provided on the light detection panel 7 to cover the light-receiving unit 3. The scintillator layer 8 is configured by using a plurality of scintillators 8a having a columnar structure. The scintillators 8a receive radiation to generate light (scintillator light). The material of the scintillator 8a is not particularly limited, but is, for example, cesium iodide (CsI) doped with thallium (TI) or sodium (Na) having good luminous efficiency. The height of the scintillator layer 8 is, for example, about 600 μm. Further, the outer edge portion of the scintillator layer 8 has a tapered shape in which the height gradually decreases toward the outside of the scintillator layer 8.

Figure 2:
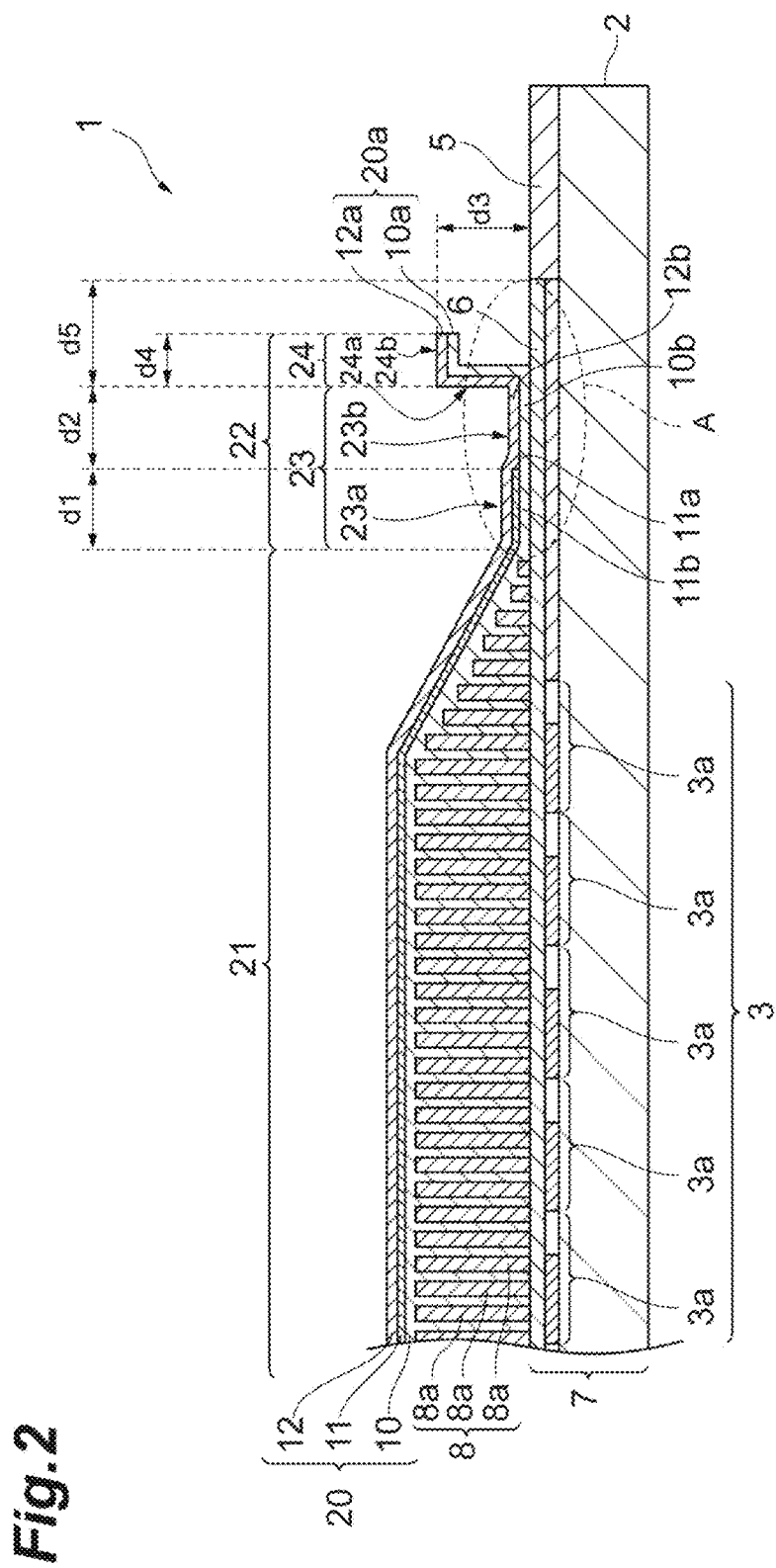
FIG. 2 is a cross-sectional view taken along the line II-II of FIG. 1.

As illustrated in FIG. 2, a protective layer 20 is provided on the light detection panel 7 to cover the scintillator layer 8. The protective layer 20 has a property of transmitting radiation and blocking moisture. The protective layer 20 has a light reflection film 11, a first protective film 10 that is disposed on the side of the scintillator layer 8 with respect to the light reflection film 11, and a second protective film 12 that is disposed on the side opposite to the scintillator layer 8 with respect to the light reflection film 11. The first protective film 10 and the second protective film 12 are, for example, organic films made of polyparaxylylene resin, poly-para-chloroxyilylene and the like. The light reflection film 11 is a metal film made of aluminum or silver. As an example, the thickness of the first protective film 10 is about 20 µm, the thickness of the light reflection film 11 is about 200 nm (2000 Å), and the thickness of the second protective film 12 is about 10 µm. In this case, the thickness of the protective layer 20 is about 30.2 µm.

The protective layer 20 has a main body portion 21 and an outer edge portion 22. The main body portion 21 is a portion that covers the scintillator layer 8. The first protective film 10 in the main body portion 21 is provided on the scintillator layer 8 to have the above-mentioned thickness. The first protective film 10 may be provided on the scintillator layer 8, while filling the space between the plurality of scintillators 8a having a columnar structure. The outer edge portion 22 is provided outside the main body portion 21 so as to be continuous with the main body portion 21.

The outer edge portion 22 has an adhesive portion 23 and an extension 24. The adhesive portion 23 is in close contact with the light detection panel 7 in a region A between the scintillator layer 8 and the bonding pad 5. For example, since a part of the first protective film 10 on the scintillator layer 8 side of the adhesive portion 23 has an adhesive surface with the light detection panel 7, the adhesive portion 23 comes into close contact with the light detection panel 7. By increasing the adhesive surface (for example, by increasing the length d1+d2 of the adhesive portion), the adhesion between the adhesive portion 23 and the light detection panel 7 is enhanced.

The adhesive portion 23 has a first portion 23a and a second portion 23b. The first portion 23a is a portion positioned on the side of the main body portion 21, and has a three-layer structure including the first protective film 10, the light reflection film 11 and the second protective film 12. The second portion 23b is a portion located opposite to the main body portion 21 across the first portion 23a, and has a two-layer structure including the first protective film 10 and the second protective film 12. Therefore, the outer edge 11a of the light reflection film 11 is located inside (on the side of the scintillator layer 8) the outer edge 20a of the protective layer 20. In the first portion 23a, the outer edge portion 10b of the first protective film 10 and the outer edge portion 12b of the second protective film 12 sandwich the light reflection film 11. The second portion 23b is located outside (on the side of the bonding pad 5) the outer edge portion 11b of the light reflection film 11. In the second portion 23b, the outer edge portion 10b of the first protective film 10 and the outer edge portion 12b of the second protective film 12 are joined to each other. In a case where the first protective film 10 and the second protective film 12 are made of the same material, the first protective film 10 and the second protective film 12 may be integrated. In the adhesive portion 23, the outer edge portion 10b of the first protective film 10 and the outer edge portion 12b of the second protective film 12 cover the outer edge portion 11b of the light reflection film 11.

The extension 24 has a two-layer structure including the first protective film 10 and the second protective film 12, and extends from the adhesive portion 23 to the opposite side of the light detection panel 7 in a self-supporting state. The extension 24 is a portion located on the side of the outermost edge 20a of the protective layer 20. Therefore, the outer edge 10a of the first protective film 10 and the outer edge 12a of the second protective film 12 are located at the outer edge 20a of the protective layer 20. The extension 24 has a rising portion 24a and a piece portion 24b. The rising portion 24a extends toward the opposite side of the light detection panel 7 in a self-supporting state with a portion of the adhesive portion 23 on the opposite side to the main body portion 21 as a proximal end. Here, the "self-supporting state" means a state in which the rising portion 24a stands up without being held or supported by any member (for example, resin or the like). The proximal end portion of the rising portion 24a is connected to the adhesive portion 23, but other portions of the rising portion 24a are not connected to any element of the radiation detector 1.

The rising portion 24a extends in a direction orthogonal to the light detection panel 7 (that is, the rising portion 24a stands upright from the light detection panel 7) in a self-supporting state. However, the extending direction of the rising portion 24a is not limited thereto. The rising portion 24a may extend in a direction intersecting with the plane direction of the light detection panel 7 in a self-supporting state. For example, the rising portion 24a may be inclined toward the bonding pad 5 side on the basis of the upright state from the light detection panel 7, or may be inclined toward the opposite side (toward the scintillator layer 8 side). Further, the rising portion 24a does not need to extend along the plane, and may extend along, for example, a curved surface.

The piece portion 24b protrudes from the upper portion of the rising portion 24a toward the bonding pad 5 side. The piece portion 24b protrudes in a direction parallel to the surface direction of the light detection panel 7. However, the protruding direction of the piece portion 24b is not limited thereto. The piece portion 24b may protrude in a direction different from the extending direction of the rising portion 24a. For example, the piece portion 24b may be inclined toward the light detection panel 7 side on the basis of the state of protruding in the surface direction of the light detection panel 7, or may be inclined to the opposite side. Further, the piece portion 24b does not need to protrude along the plane, and for example, may protrude along the curved surface.

In FIG. 2, the length d1 and the length d2 represent the length of the adhesive portion 23. Specifically, the length d1 represents the length of the first portion 23a of the adhesive portion 23, and the length d2 represents the length of the second portion 23b of the adhesive portion 23. The total length of the length d1 and the length d2 is, for example, about 1000 µm or less. The length d3 represents the height of the rising portion 24a, that is, the height of the extension 24. The length d3 is, for example, 80 to 250 µm. The length d4 represents the length of the piece portion 24b of the extension 24. The length d4 is, for example, about 300 µm or less. The length d5 represents the distance from the boundary between the adhesive portion 23 and the extension 24 to the bonding pad 5. The length d5 is set to be longer than the length d4 (for example, about several tens to several hundred µm) so that the extension 24 and the bonding pad 5 do not interfere with each other.

Next, the function and effect of the radiation detector 1 will be described. In the radiation detector 1, the outer edge portion 22 of the protective layer 20 covering the scintillator layer 8 has an adhesive portion 23 coming into close contact with the light detection panel 7. This makes it possible to prevent moisture from entering the scintillator layer 8 through the gap between the protective layer 20 and the light detection panel 7. Further, the outer edge portion 22 of the protective layer 20 has an extension 24 that extends from the adhesive portion 23 to the opposite side of the light detection panel 7 in a self-supporting state. If the outer edge portion 22 of the protective layer 20 does not have the extension 24, the outer edge 20a of the protective layer 20 is included in the adhesive portion 23. In this case, in particular, it is difficult to secure the adhesion between a portion of the adhesive portion 23, in which the outer edge 20a of the protective layer 20 is located, and the light detection panel 7. As a result, moisture easily enters the scintillator layer 8 from the interface between the adhesive portion 23 and the light detection panel 7. In contrast, in the radiation detector 1, the outer edge portion 22 of the protective layer 20 has the extension 24, and the outer edge 20a of the protective layer 20 is not included in the adhesive portion 23. Therefore, the adhesion between the adhesive portion 23 and the light detection panel 7 is sufficiently secured, and the moisture resistance of the scintillator layer 8 can be improved as compared with a case where the extension 24 does not exist. Therefore, it is possible to maintain the moisture resistance of the scintillator layer 8 without holding the outer edge portion of the protective layer 20 with a resin member as in the conventional case. Furthermore, since it is not necessary to provide such a resin member (for example, about 900 µm in width), it is possible to narrow the region A between the scintillator layer 8 and the bonding pad 5. Therefore, according to the radiation detector 1, it is possible to suppress the region between the scintillator layer 8 and the bonding pad 5 from being widened, while ensuring the moisture resistance of the scintillator layer 8. Further, since the region A is narrowed, the signal line 4 for electrically connecting the light-receiving unit 3 and the bonding pad 5 can be shortened accordingly, and the transmission speed of the electric signal can be improved. Further, it is also possible to suppress an increase in noise by the short signal line 4.

The protective layer 20 has a light reflection film 11 that is a light reflection film, a first protective film 10 that is disposed on the side of the scintillator layer 8 with respect to the light reflection film 11, a second protective film 12 that is disposed on the side opposite to the scintillator layer 8 with respect to the light reflection film 11. By including the light reflection film 11 in the protective layer 20 as described above, it is possible to prevent the light generated in the scintillator layer 8 from leaking to the outside (portion other than the light-receiving unit 3), and it is possible to improve the sensitivity of the radiation detector 1. Further, by providing the first protective film 10 and the second protective film 12 on both sides of the light reflection film 11, for example, the light reflection film 11 can also be protected.

The outer edge 11a of the light reflection film 11 is located inside the outer edge 20a of the protective layer 20, and the outer edge 10a of the first protective film 10 and the outer edge 12a of the second protective film 12 are located on the outer edge 20a of the protective layer 20. Further, the outer edge portion 10b of the first protective film 10 and the outer edge portion 12b of the second protective film 12 are joined to each other on the outer side of the outer edge 11a of the light reflection film 11, and cover the outer edge portion 11b of the light reflection film 11. For example, even when adhesion between the light reflection film 11 and the first protective film 10 or adhesion between the light reflection film 11 and the second protective film 12 is not good, since the outer edge portion 11b of the light reflection film 11 is sealed by the outer edge portion 10b of the first protective film 10 and the outer edge portion 12b of the second protective film 12, it is possible to ensure the adhesion between these films.

Since the light reflection film 11 is a metal film made of aluminum or silver, it is possible to improve the light reflectivity of the light reflection film 11.

Since the height of the extension 24 is 80 µm to 250 µm, the moisture resistance of the scintillator layer 8 can be more reliably secured.

The extension 24 has a rising portion 24a, and a piece portion 24b protruding from the upper portion of the rising portion 24a toward the bonding pad 5 side. Since the extension 24 includes not only the rising portion 24a but also the piece portion 24b, the outer edge 20a of the protective layer 20 can be sufficiently away from the adhesive portion 23, and adhesion between the adhesive portion 23 and the light detection panel 7 can be more reliably secured. Even in this case, since the length of the piece portion 24b is, for example, about 300 µm or less, it is possible to narrow the region A between the scintillator layer 8 and the bonding pad 5, as compared with a case where a resin member (for example, having a width of about 900 µm as described above) is provided as in the related art.

For example, when a conductive member such as a wire is bonded to the bonding pad 5 in the wiring process, there is a possibility that foreign matter or the like may fly from the bonding portion toward the scintillator layer 8 side. Even in this case, the extension 24 functions as a protective wall which protects the scintillator layer 8 from foreign matter or the like. Thus, it is possible to prevent contamination of the scintillator layer 8 at the time of bonding.

Some of the light detection panel 7 may be expensive. In a case where the radiation detector 1 does not satisfy the quality standard or the like in the inspection of the producing process, it is conceivable to reuse the light detection panel 7 rather than discarding the entire radiation detector 1. In that case, the scintillator layer 8 provided on the light detection panel 7 is removed, and a new scintillator layer 8 is provided on the light detection panel 7. However, for this purpose, the protective layer 20 needs to be removed. According to the radiation detector 1 of the present embodiment, the outer edge portion 22 of the protective layer 20 has an extension 24 that extends from the adhesive portion 23 to the opposite side of the light detection panel 7 in a self-supporting state. Therefore, the protective layer 20 can be relatively easily removed, by peeling the protective layer 20 from the light detection panel 7 with the extension 24 as a starting point, for example, by grasping and pulling up the extension 24.

Figure 3:
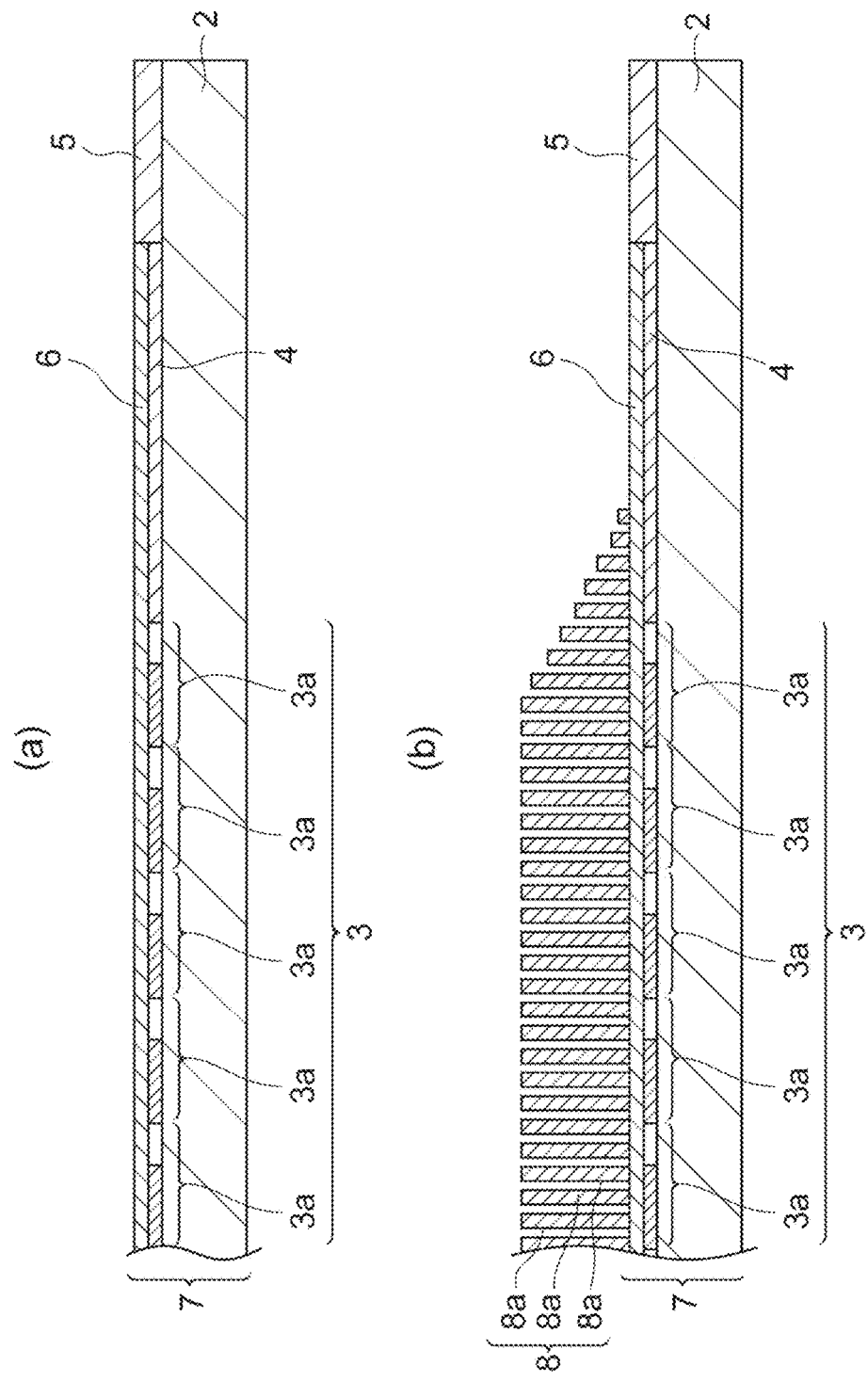
FIG. 3 is a first diagram illustrating an example of a producing process of the radiation detector.
Figure 4:
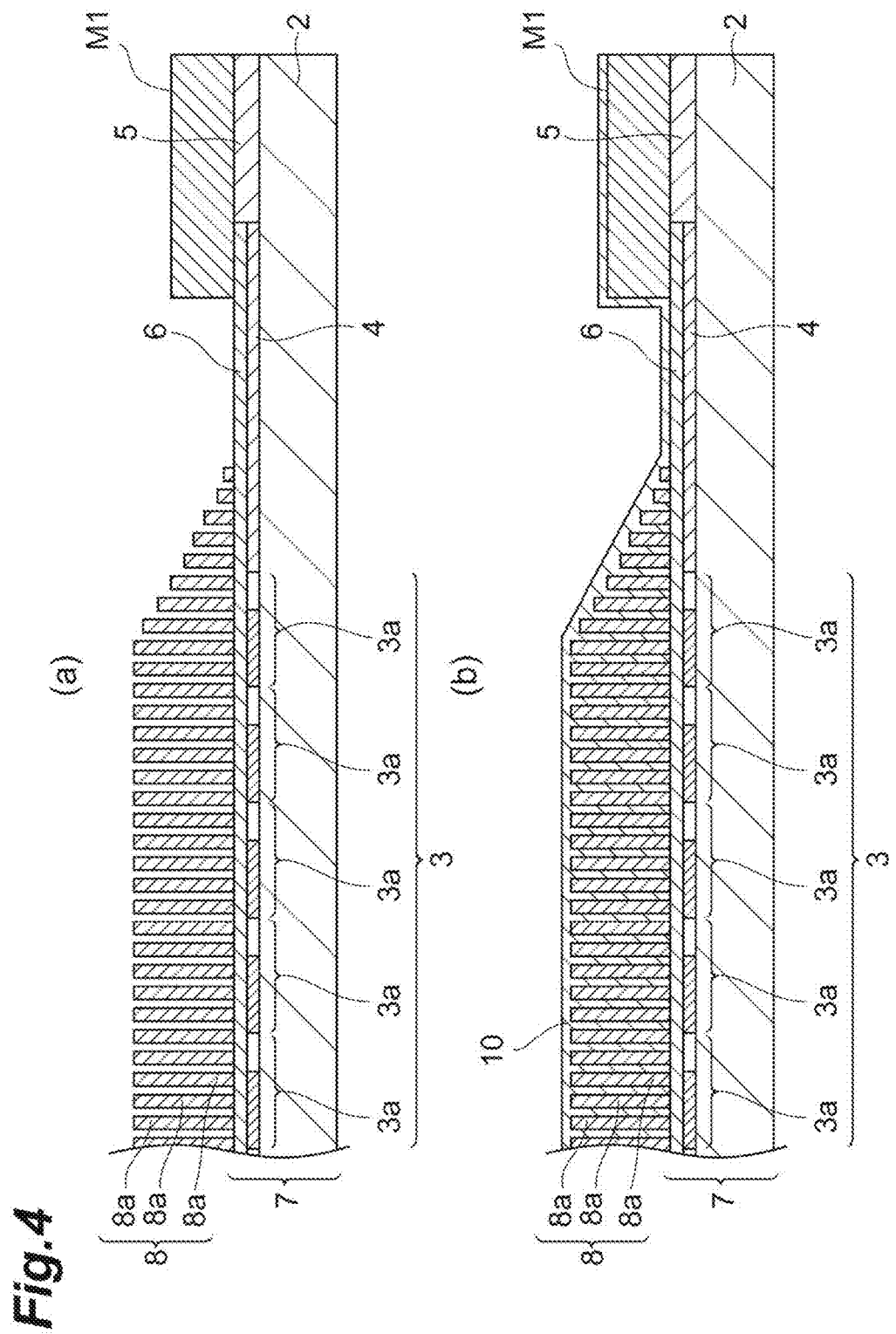
FIG. 4 is a second diagram illustrating an example of a producing process of the radiation detector.
Figure 5:
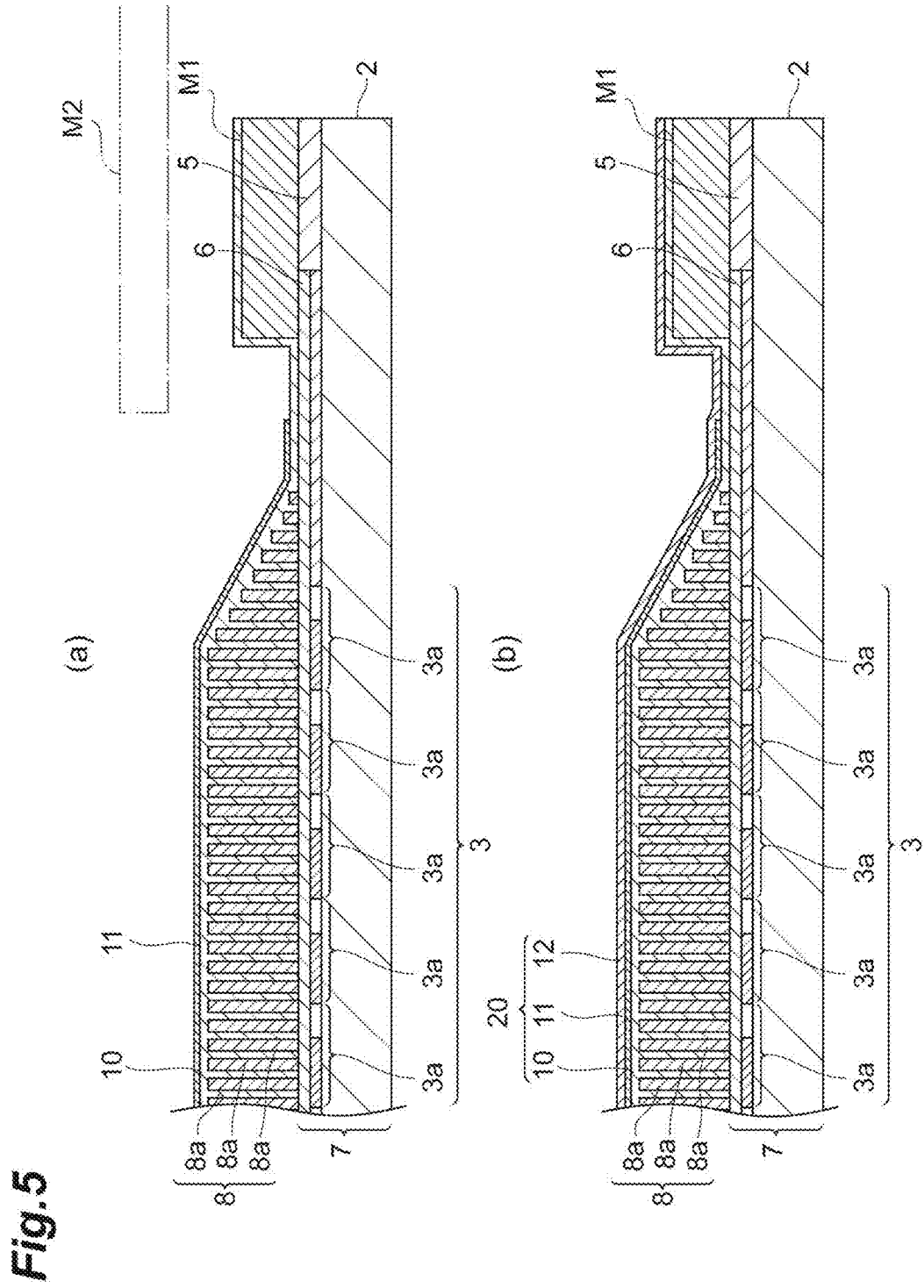
FIG. 5 is a third diagram illustrating an example of a producing process of the radiation detector.
Figure 6:
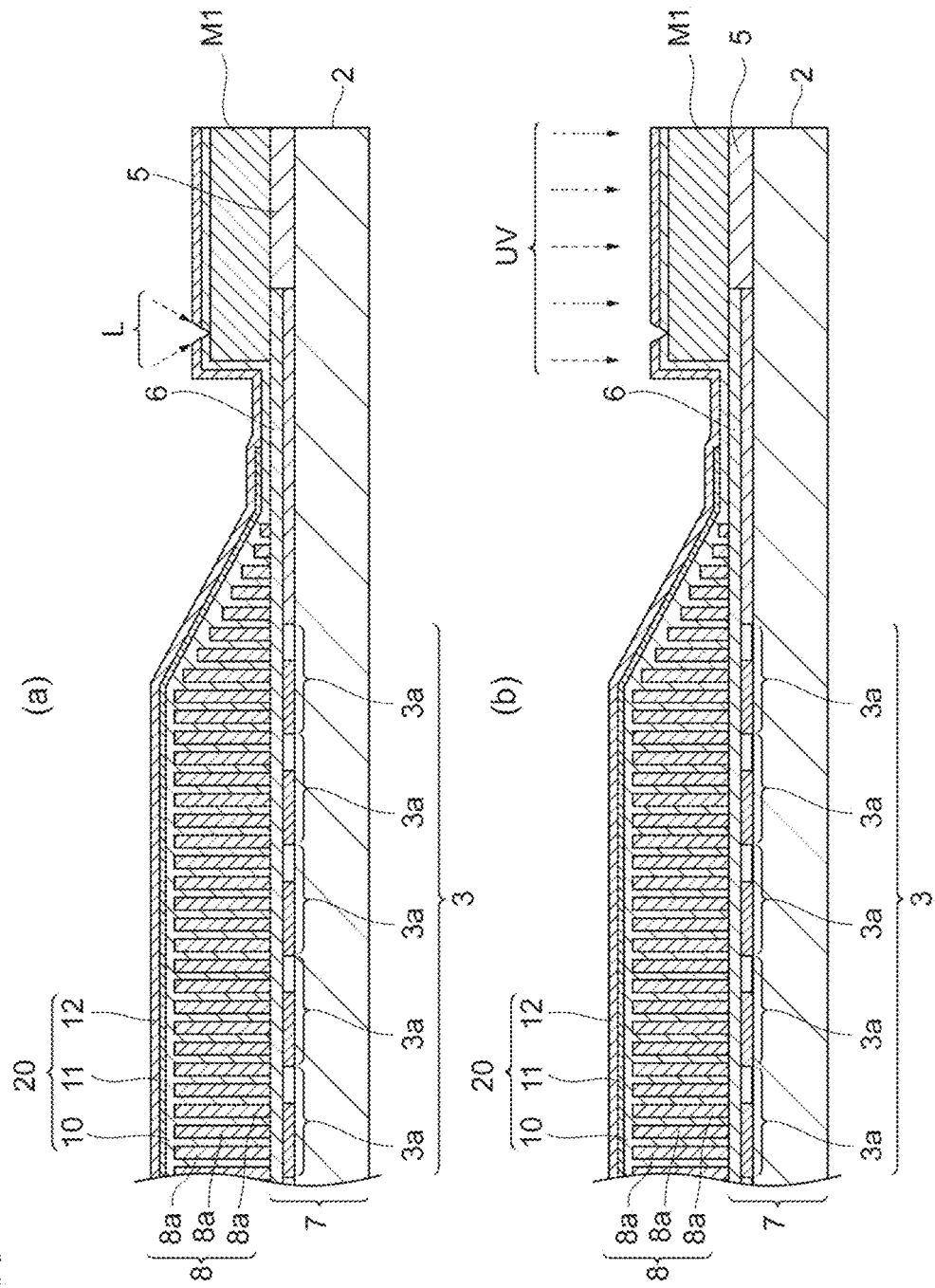
FIG. 6 is a fourth diagram illustrating an example of a producing process of the radiation detector.

Next, referring to FIGS. 3 to 7, each process of the method for producing the radiation detector 1 will be described. First, as illustrated in FIG. 3(a), the light detection panel 7 described with reference to FIGS. 1 and 2 is prepared. Further, as illustrated in FIG. 3(b), the scintillator layer 8 is provided on the light detection panel 7 to cover the light-receiving unit 3. For example, in the region on the light detection panel 7 covering the light-receiving unit 3, by growing columnar crystals of CsI doped with Tl by a vapor deposition, the scintillator layer 8 is formed (laminated).

Next, as illustrated in FIG. 4(a), a masking member M1 is provided on the light detection panel 7 to cover the bonding pad 5. An example of the masking member M1 is an UV cured masking tape (hereinafter, an UV tape). Since a plurality of bonding pads 5 is disposed along the side of the outer edge of the substrate 2, the adhesive surface of the UV tape may be stuck on the light detection panel 7 to cover the bonding pad 5, while aligning the arrangement direction of the bonding pads 5 and the longitudinal direction of the UV tape. The thickness of the IN tape may be, for example, about 110 µm or less. In order to adjust the thickness of the masking member M1, a plurality of UV tapes may be provided to overlap each other.

The protective layer 20 is provided on the light detection panel 7 to cover the scintillator layer 8, the region A, and the masking member M1. Specifically, as illustrated in FIG. 4(b), the first protective film 10 is first formed. For example, the entire surface of the substrate 2 is covered with polyparaxylylene or the like by the CVD method. Next, as illustrated in FIG. 5(a), the light reflection film 11 is formed on the first protective film 10. For example, an Al film is laminated on the light reflection film 11 by a vapor deposition method. Here, the bonding pad 5 may not be covered with the light reflection film 11. In that case, the Al film may be deposited after masking the bonding pad 5 with the masking member M2. As the masking member M2, for example, a UV tape may be used. Further, as illustrated in FIG. 5(b), a second protective film 12 is formed. For example, the entire surface of the substrate 2 is covered with polyparaxylylene or the like again by the CVD method.

Subsequently, as illustrated in FIG. 6(a), the protective layer 20 is cut on the masking member M1 by irradiating the laser beam L. For example, by moving a laser beam head (not illustrated) which irradiates the laser beam L to a stage (not illustrated) on which the substrate 2 is placed, the laser beam L is scanned along the edge portion of the scintillator layer 8 side of the masking member M1.

Figure 7:
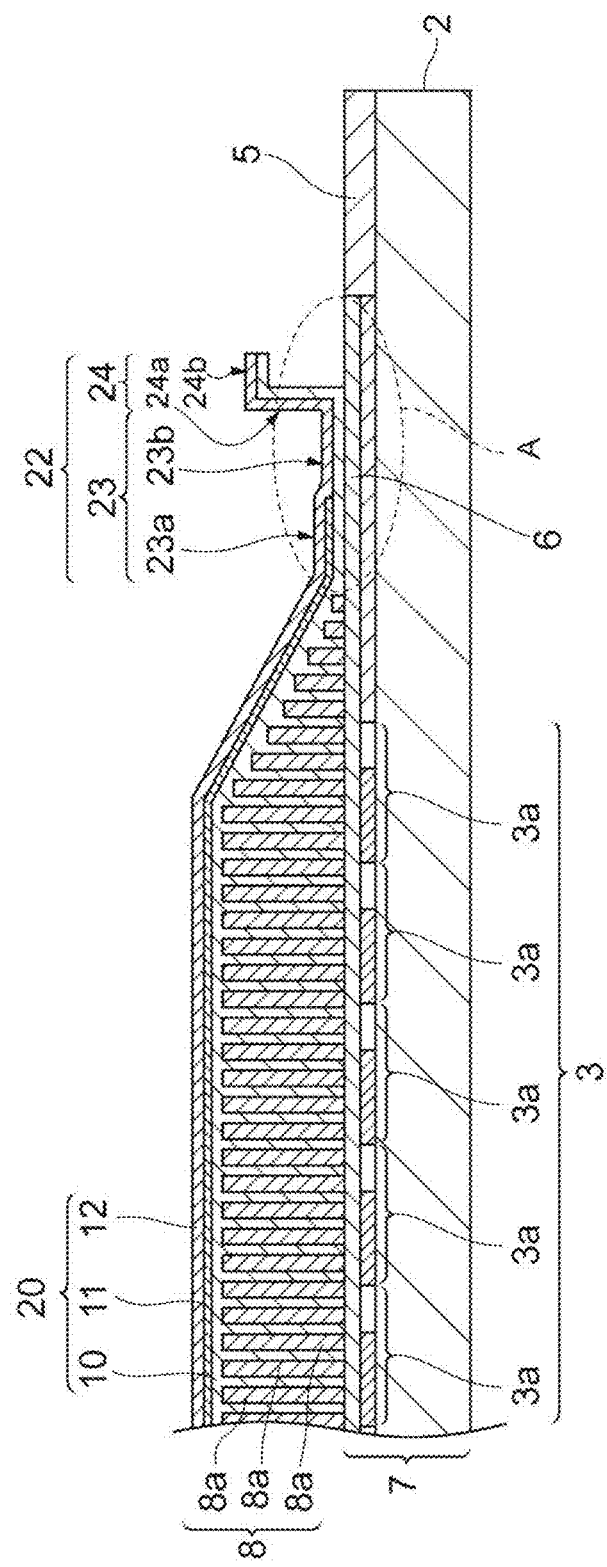
FIG. 7 is a fifth diagram illustrating an example of a producing process of the radiation detector.

Further, the masking member M1 is removed. Specifically, the masking member M1 is removed by lowering the adhesive strength of the adhesive surface of the masking member M1 which is a UV tape. First, as illustrated in FIG. 6(b), UV (ultraviolet) irradiation is performed toward the masking member M1. UV passes through the protective layer 20 and reaches the masking member M1. When the masking member M1 is subjected to UV irradiation, the adhesive surface loses the adhesive force. Further, as illustrated in FIG. 7, the masking member M1 is removed. A portion of the cut protective layer 20 covering the masking member M1 is also removed together with the masking member M1. As a result, the bonding pad 5 is exposed.

According to the aforementioned method for producing the radiation detector 1, the bonding pad 5 is covered with the masking member M1, and the protective layer 20 is provided to cover the scintillator layer 8, the region between the scintillator layer 8 and the bonding pad 5, and the masking member M1. As a result, the protective layer 20 has the adhesive portion 23 that comes into close contact with the light detection panel 7 in the region A between the scintillator layer 8 and the bonding pad 5. Further, a step due to the thickness of the masking member M1 is generated between the edge of the masking member M1 and the light detection panel 7, but the protective layer 20 is also formed along the step. As a result, the protective layer 20 has the extension 24 extending from the adhesive portion 23 to the side opposite to the light detection panel 7. Further, by irradiating the laser beam L along the edge portion of the scintillator layer 8 side of the masking member M1, the protective layer 20 is cut on the masking member M1, and the masking member M1 is removed. As a result, the bonding pad 5 is exposed, and the extension 24 is in the self-supporting state, without coming into contact with the masking member M1. Further, the extension 24 includes a rising portion 24a formed along a step formed by the edge of the masking member M1, and a piece portion 24b formed between the rising portion 24a and the edge portion of the masking member M1 to which laser beam is irradiated. The radiation detector 1 thus produced has the adhesive portion 23 that comes into close contact with the light detection panel 7 in the region A between the scintillator layer 8 and the bonding pad 5, and the extension 24 (including the rising portion 24a and the piece portion 24b) extending from the adhesive portion 23 to the opposite side of the light detection panel 7 in the self-supporting state. Thus, as described above, it is possible to maintain the moisture resistance of the scintillator layer 8 and to narrow the region A between the scintillator layer 8 and the bonding pad 5.

Here, there is also a possibility that the bonding pad 5 may be damaged by irradiation of the laser beam L. However, in the method for producing the radiation detector 1, the protective layer 20 is cut on the masking member M1 in a state in which the bonding pad 5 is covered with the masking member M1. At this time, the masking member M1 plays a role as an absorbing layer which absorbs the laser beam L. Therefore, it is possible to prevent the bonding pad 5 from being damaged due to irradiation of the laser beam L to the bonding pad 5.

In the method for producing the radiation detector 1, since the protective layer 20 is cut by irradiation of the laser beam L, the adhesive portion 23 and the extension 24 can be accurately shaped at the outer edge portion 22 of the protective layer 20. Even when the bonding pads 5 are disposed at predetermined intervals along not only one side of the outer edge of the substrate 2 but also a plurality of sides (for example, two to four sides), since the laser beam L may be scanned for each side, the adhesive portion 23 and the extension 24 can be easily shaped at the outer edge portion 22.

Although an embodiment of the present invention has been described above, the present invention is not limited to the above embodiment. For example, the outer edge 11a of the light reflection film 11 may be located at the outer edge 20a of the protective layer 20, together with the outer edge 10a of the first protective film 10 and the outer edge 12a of the second protective film 12.

The light reflection film 11 may be a resin film containing a white pigment (alumina, titanium oxide, zirconium oxide, yttrium oxide or the like). When a resin film containing a white pigment is used as the light reflection film 11, by further laminating a metal film (for example, aluminum) and a third protective film (the same material as the first and second protective films) in this order after forming the second protective film 12, it is possible to obtain the same moisture resistance as the metal reflective film and the light output higher than that of the metal reflective film, even in the resin reflective film having poor moisture resistance. Even in this case, the light reflection film 11 having light reflectivity can be attained.

Figure 8:
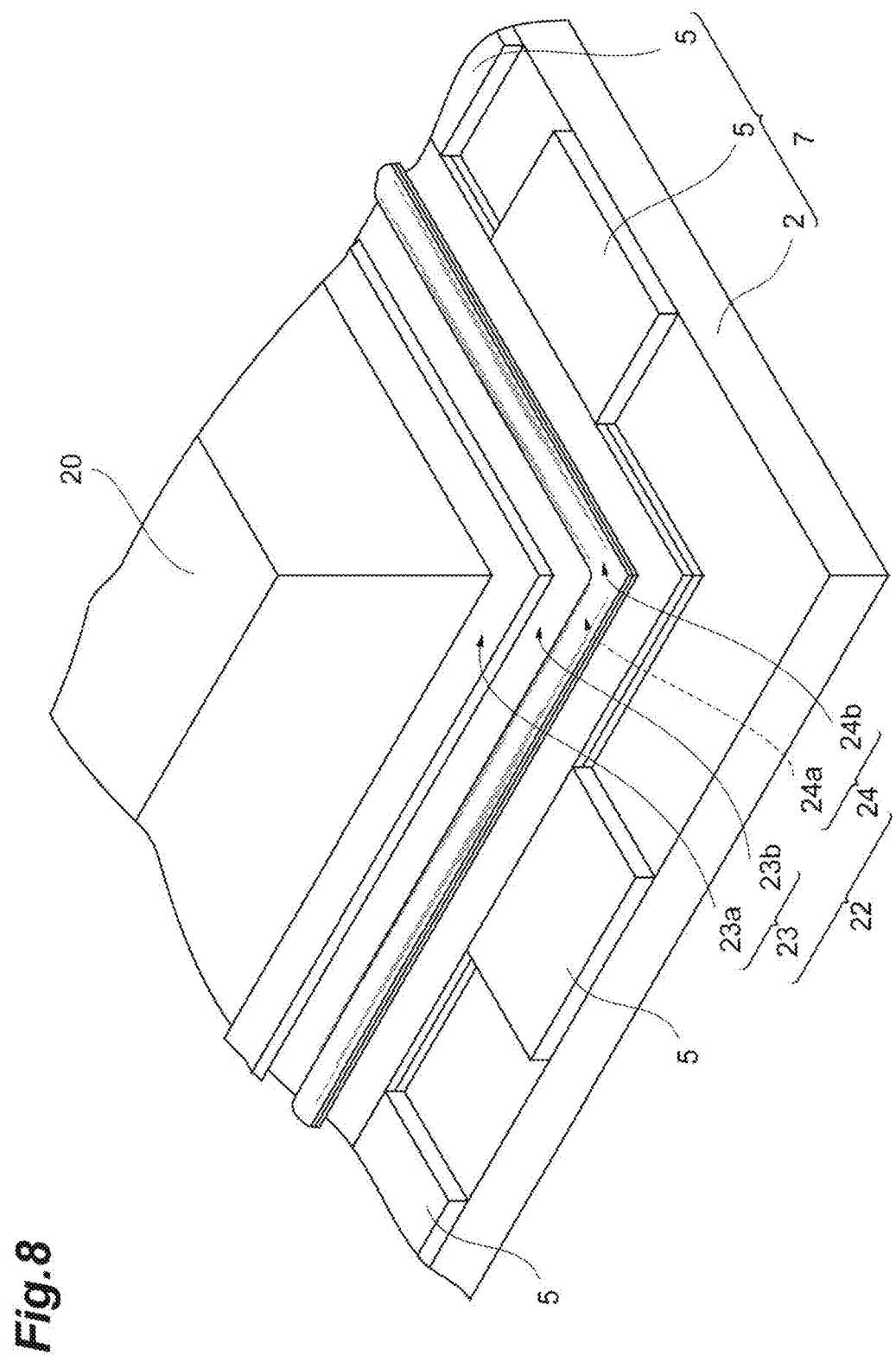
FIG. 8 is a first perspective view of the radiation detector.
Figure 9:
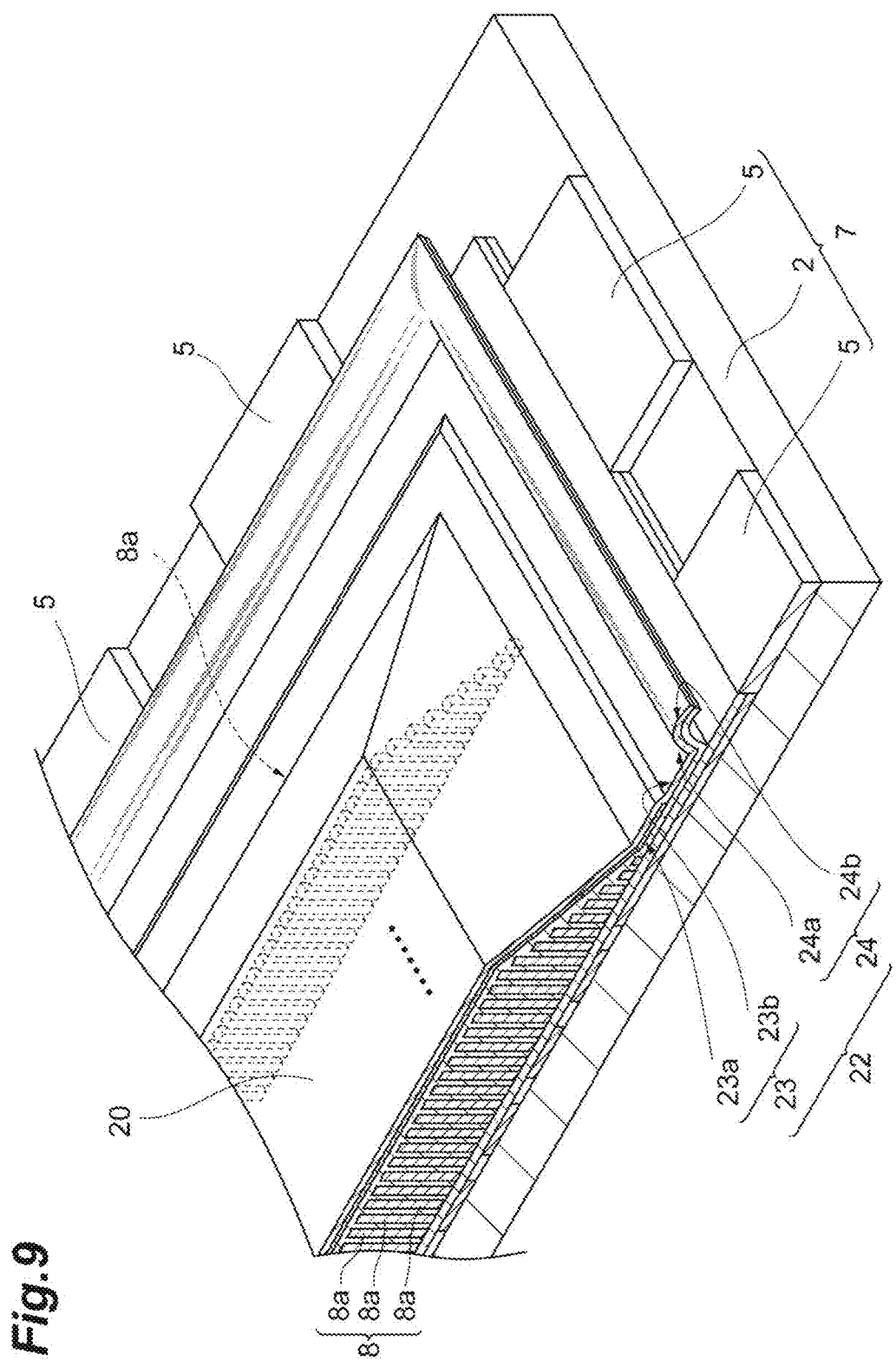
FIG. 9 is a second perspective view of the radiation detector.

Here, an external shape of the radiation detector 1 will be described. FIG. 8 is a perspective view schematically illustrating a corner portion of the radiation detector 1, and FIG. 9 is a perspective view schematically illustrating a corner portion of the radiation detector 1 as viewed from an angle different from that of FIG. 8. In FIG. 9, a cross-section thereof is illustrated so that the scintillator layer 8 covered with the protective layer 20 can be seen, and a plurality of scintillators 8a having a columnar structure is illustrated by a dashed line. As understood from FIGS. 8 and 9, the outer edge portion 22 of the protective layer 20 has an adhesive portion 23 that comes into close contact with the light detection panel 7 in the region (region A in FIG. 2 etc.) between the scintillator layer 8 and the bonding pad 5, and an extension 24 that extends from the adhesive portion 23 to the opposite side of the light detection panel 7 in the self-supporting state. As illustrated in FIGS. 8 and 9, the rising portion 24a is inclined toward the bonding pad 5, and the piece portion 24b may also be inclined toward the bonding pad 5. Further, the connecting portion between the rising portion 24a and the piece portion 24b may not be bent at right angles but may be smoothly bent.

REFERENCE SIGNS LIST

1 . . . radiation detector, 3 . . . light-receiving unit, 5 . . . bonding pad, 7 . . . light detection panel, 8 . . . scintillator layer, 10 . . . first protective film, 11 . . . light reflection film, 12 . . . second protective film, 20 . . . protective layer, 22 . . . outer edge portion, 23 . . . adhesive portion, 24 . . . extension, M1 . . . masking member.

The invention claimed is:

1. A radiation detector comprising:
a light detection panel that has a light-receiving unit, and a bonding pad that is electrically connected to the light-receiving unit;
a scintillator layer that is provided on the light detection panel to cover the light-receiving unit; and
a protective layer that is provided on the light detection panel to cover the scintillator layer so that the scintillator layer is located between the light detection panel and the protective layer,
wherein an outer edge portion of the protective layer has
an adhesive portion that is in close contact with the light detection panel in a region between the scintillator layer and the bonding pad, and
an extension that is connected to the adhesive portion at a proximal end of the extension and that extends from the adhesive portion to an opposite side of the light detection panel in a self-supporting state in which the extension is not connected to any other element of the radiation detector other than the adhesive portion at the proximal end of the extension.

2. The radiation detector according to claim 1,
wherein the protective layer has
a light reflection film,
a first protective film that is disposed on the scintillator layer side with respect to the light reflection film, and
a second protective film that is disposed on the opposite side of the scintillator layer with respect to the light reflection film.

3. The radiation detector according to claim 2,
wherein an outer edge of the light reflection film is located inside an outer edge of the protective layer,
the outer edge portion of the first protective film and the outer edge portion of the second protective film are located at the outer edge of the protective layer, and
the outer edge portion of the first protective film and the outer edge portion of the second protective film are joined to each other outside the outer edge of the light reflection film, and cover the outer edge portion of the light reflection film.

4. The radiation detector according to claim 2,
wherein the light reflection film is a metal film made of aluminum or silver.

5. The radiation detector according to claim 2,
wherein the light reflection film is a resin film containing a white pigment.

6. The radiation detector according to claim 1,
wherein a height of the extension is 80 μm to 250 μm.

7. A method for producing a radiation detector, the method comprising:
preparing a light detection panel having a light-receiving unit and a bonding pad electrically connected to the light-receiving unit, and providing a scintillator layer on the light detection panel to cover the light-receiving unit;
providing a masking member on the light detection panel to cover the bonding pad;
providing a protective layer on the light detection panel to cover the scintillator layer, a region between the scintillator layer and the bonding pad, and the masking member, so that the scintillator layer is located between the light detection panel and the protective layer;
cutting the protective layer on the masking member by irradiating a laser beam along an edge portion of the scintillator side of the masking member; and
removing the masking member,
wherein an outer edge portion of the protective layer has
an adhesive portion that is in close contact with the light detection panel in a region between the scintillator layer and the bonding pad, and
an extension that is connected to the adhesive portion at a proximal end of the extension and that extends from the adhesive portion to an opposite side of the light detection panel in a self-supporting state in which the extension is not connected to any other element of the radiation detector other than the adhesive portion at the proximal end of the extension.

* * * * *